United States Patent
Sasaki et al.

(10) Patent No.: US 7,157,208 B2
(45) Date of Patent: Jan. 2, 2007

(54) POSITIVE RESIST COMPOSITION AND PATTERN FORMING METHOD USING THE SAME

(75) Inventors: Tomoya Sasaki, Shizuoka (JP); Kazuyoshi Mizutani, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 11/060,533

(22) Filed: Feb. 18, 2005

(65) Prior Publication Data
US 2005/0186506 A1    Aug. 25, 2005

(30) Foreign Application Priority Data
Feb. 20, 2004    (JP) .......................... P. 2004-044693

(51) Int. Cl.
*G03F 7/004*    (2006.01)
*G03F 7/30*    (2006.01)
(52) U.S. Cl. .................. 430/270.1; 430/326; 430/905; 430/910
(58) Field of Classification Search ...................... None
See application file for complete search history.

(56) References Cited

U.S. PATENT DOCUMENTS

| | | |
|---|---|---|
| 5,844,057 A | 12/1998 | Watanabe et al. |
| 6,022,665 A | 2/2000 | Watanabe et al. |
| 2005/0266336 A1 * | 12/2005 | Kodama .................. 430/270.1 |

FOREIGN PATENT DOCUMENTS

| | | |
|---|---|---|
| EP | 1 273 969 A2 | 1/2003 |
| EP | 1 319 981 A2 | 6/2003 |
| JP | 6-41221 A | 2/1994 |
| JP | 2000-122291 A | 4/2000 |
| JP | 3173368 B2 | 3/2001 |
| JP | 2001-114825 A | 4/2001 |
| JP | 2001-206917 A | 7/2001 |
| JP | 2002-323768 A | 11/2002 |

OTHER PUBLICATIONS

XP-002333781 (2002)—Derwent Publications Ltd., (JP 2002-323768—Abstract).
XP-002333782 (1999)—Derwent Publications Ltd., (JP 11-282163—Abstract).
European Search Report dated Jul. 8, 2005.

* cited by examiner

*Primary Examiner*—Rosemary Ashton
(74) *Attorney, Agent, or Firm*—Sughrue Mion, PLLC

(57) ABSTRACT

A positive resist composition satisfying all of high sensitivity, high resolution, good pattern profile, good line edge roughness and good in-vacuum PED characteristics, is provided, the positive resist composition comprising: (A) a resin containing a repeating unit having a specific styrene skeleton, which is insoluble or hardly soluble in an alkali developer and becomes soluble in an alkali developer under the action of an acid; (B) a compound capable of generating an acid upon irradiation with actinic rays or radiation; and (C) an organic basic compound, and a pattern formation method using the positive resist composition.

14 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitably used in the ultramicrolithography process of producing, for example, VLSI or high-capacity microchip or in other photofabrication processes. More specifically, the present invention relates to a positive resist composition capable of forming a highly refined pattern with use of electron beam, X-ray, EUV light or the like, that is, a positive resist composition suitably usable for fine processing of a semiconductor device, where electron beam, X-ray or EUV light (wavelength: around 13 nm) is used.

2. Background Art

In the process of producing a semiconductor device such as IC and LSI, fine processing by lithography using a resist composition has been conventionally performed. Recently, the integration degree of integrated circuits is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

In particular, the electron beam lithography is positioned as a pattern formation technique of the next generation or second next generation and a high-sensitivity and high-resolution positive resist is being demanded. In order to shorten the wafer processing time, the elevation of sensitivity is very important, but when higher elevation is sought for, not only reduction of resolution but also worsening of line edge roughness are brought about and development of a resist satisfying these properties at the same time is strongly demanded. The line edge roughness as used herein means that the edge of resist at the interface between the pattern and the substrate irregularly fluctuates in the direction perpendicular to the line direction due to the resist characteristics and when the pattern is viewed from right above, the edge gives an uneven appearance. This unevenness is transferred by the etching step using the resist as a mask and causes deterioration of electric characteristics, giving rise to decrease in the yield. Particularly, in the ultrafine region of 0.25 µm or less, the improvement of line edge roughness is a very important problem to be solved. The high sensitivity is in a trade-off relationship with high resolution, good pattern profile and good line edge roughness and it is very important how to satisfy these matters at the same time. Also, the image performance stability (in-vacuum PED) during standing after exposure in a vacuum is a very important performance when exposure is performed in a vacuum as done with electron beam, X-ray or EUV light. If the in-vacuum PED characteristics are bad, the performance greatly changes between initial stage and end stage of image-drawing at the time of drawing an image with electron beam or X-ray, as a result, the in-plane uniformity of the drawn pattern greatly fluctuates to cause serious decrease in the yield.

Furthermore, there is a problem that the above-described line edge roughness is also worsened during standing in a vacuum.

In the case of using EUV as a light source, the wavelength of light belongs to an extreme ultraviolet region and in corporation with a photochemical reaction such as negative conversion ascribable to EUV light, its high energy gives rise to a problem such as reduction of contrast. Therefore, also in the lithography using X-ray or EUV light, an important problem to be solved is to satisfy high sensitivity as well as high resolution and the like at the same time.

As for the resist suitable for the lithography process using electron beam, X-ray or EUV light, a chemical amplification-type resist utilizing an acid catalytic reaction is mainly used in view of high sensitivity and in the case of a positive resist, a chemical amplification-type resist composition mainly comprising an acid generator and a phenolic polymer which is insoluble or hardly soluble in an alkali developer but becomes soluble in an alkali developer under the action of an acid (hereinafter simply referred to as a "phenolic acid-decomposable resin") is being effectively used.

With respect to the positive resist for use with electron beam, X-ray or EUV, some resist compositions containing a phenolic acid-decomposable resin have been heretofore known (see, for example, Patent Documents 1 to 6: JP-A-2002-323768 (the term "JP-A" as used herein means an "unexamined published Japanese patent application"), JP-A-6-41221, Japanese Patent No. 3,173,368, JP-A-2000-122291, JP-A-2001-114825, JP-A-2001-206917).

However, it is failed at present by any combination of these compositions to satisfy all of high sensitivity, high resolution, good pattern profile, good line edge roughness and in-vacuum PED characteristics in an ultrafine region.

SUMMARY OF THE INVENTION

An object of the present invention is to solve the problems in the technique of enhancing performances when fine processing of a semiconductor device is performed by using high-energy ray, X-ray, electron beam or EUV light, and provide a positive resist composition satisfying all of high sensitivity, high resolution, good pattern profile, good line edge roughness and good in-vacuum PED characteristics.

The present inventors have made intensive studies, as a result, surprisingly, the object of the present invention can be attained by a positive composition comprising (A) a specific phenolic acid-decomposable resin, (B) a compound capable of generating an acid upon irradiation with actinic rays or radiation and (C) an organic basic compound.

That is, the object of the present invention is attained by the following constitutions.

(1) A positive resist composition comprising:

(A) a resin containing a repeating unit represented by formula (I), which is insoluble or hardly soluble in an alkali developer and becomes soluble in an alkali developer under the action of an acid;

(B) a compound capable of generating an acid upon irradiation with actinic rays or radiation; and (C) an organic basic compound:

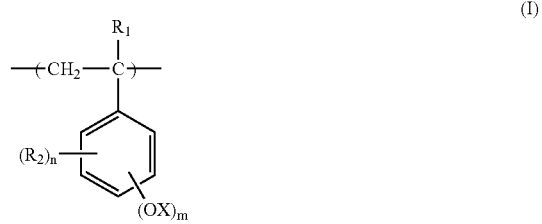

wherein $R_1$ represents a hydrogen atom, a methyl group, a cyano group, a halogen atom or a perfluoro group, $R_2$ represents a non-acid-decomposable group, X represents a hydrogen atom or an organic group, m represents an integer of 1 to 4, n represents an integer of 1 to 4, provided that $2 \leq n+m \leq 5$, when m is an integer of 2 to 4, multiple Xs may be the same or different, and when n is an integer of 2 to 4, multiple $R_2$s may be the same or different.

Examples of the non-acid-decomposable group of $R_2$ include a halogen atom, an alkyl group, a cycloalkyl group, an aryl group, an alkoxy group, an acyl group, —OC(=O)Ra, —OC(=O)ORa, —C(=O)ORa, —C(=O)N(Rb)Ra, —N(Rb)C(=O)Ra, —N(Rb)C(=O)ORa, —N(Rb)SO$_2$Ra, —SRa, —SO$_2$Ra, —SO$_3$Ra and —SO$_2$N(Rb)Ra.

Ra represents an alkyl group, a cycloalkyl group or an aryl group.

Rb represents a hydrogen atom, an alkyl group, a cycloalkyl group or an aryl group.

(2) The positive resist composition as described in (1) above, wherein the repeating unit represented by formula (I) is a repeating unit represented by formula (Ia):

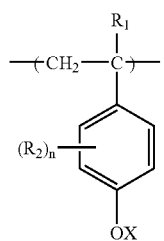

(Ia)

wherein $R_1$, $R_2$, X and n have the same meanings as those in formula (I).

(3) The positive resist composition as described in (1) above, wherein the repeating unit represented by formula (I) is a repeating unit represented by formula (Ib):

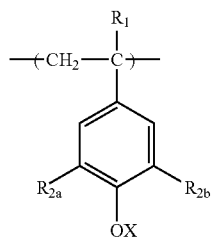

(Ib)

wherein $R_1$ and X have the same meaning as those in formula (I), and $R_{2a}$ and $R_{2b}$ each independently represents a hydrogen atom or a non-acid-decomposable group, provided that at least one of $R_{2a}$ and $R_{2b}$ is a non-acid-decomposable group.

(4) The positive resist composition as described in (1) above, wherein the non-acid-decomposable group of $R_2$ in formula (I) contains an oxygen atom.

(5) The positive resist composition as described in (4) above, wherein the non-acid-decomposable group of $R_2$ in formula (I) is an alkoxy group.

(6) The positive resist composition as described in any one of (1) to (5) above, wherein the resin (A) further contains a repeating unit represented by formula (II):

(II)

wherein $R_3$ to $R_5$ each independently represents a hydrogen atom, a fluorine atom, a chlorine atom, a cyano group or an alkyl group, and $X^1$ represents a hydrogen atom or an organic group.

Furthermore, the preferred embodiment includes the following constitutions.

(7) The positive resist composition as described in any one of (1) to (6) above, wherein at least one of a group of X in formula (I) and a group of $X_1$ in formula (II) contains at least one of an alicyclic structure and an aromatic ring structure.

(8) The positive resist composition as described in any one of (1) to (7) above, which further comprises (D) a surfactant.

(9) The positive resist composition as described in any one of (1) to (8) above, wherein the component (B) includes (B1) a compound capable of generating an organic sulfonic acid under the action of actinic rays or radiation.

(10) The positive resist composition as described in (9) above, wherein the component (B) further includes (B2) a compound capable of generating a carboxylic acid under the action of actinic rays or radiation.

(11) The positive resist composition as described in any one of (1) to (10) above, which further comprises a solvent.

(12) The positive resist composition as described in (11) above, wherein the solvent contains propylene glycol monomethyl ether acetate.

(13) The positive resist composition as described in (12) above, wherein the solvent further contains propylene glycol monomethyl ether.

(14) The positive resist composition as described in (1) to (13) above, which is for an exposure by the irradiation of electron beam, X-ray or EUV.

(15) A pattern forming method comprising: forming a resist film by using the positive resist composition described in any one of (1) to (14); and exposing and developing the resist film.

DETAILED DESCRIPTION OF THE INVENTION

The compounds for use in the present invention are described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] A resin containing a repeating unit represented by formula (I), which is insoluble or hardly soluble in an alkali developer and becomes soluble in an alkali developer under the action of an acid

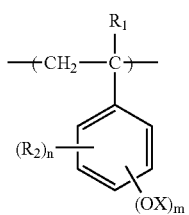

(I)

wherein $R_1$ represents a hydrogen atom, a methyl group, a cyano group, a halogen atom or a perfluoro group, $R_2$ represents a non-acid-decomposable group, X represents a hydrogen atom or an organic group, m represents an integer of 1 to 4, n represents an integer of 1 to 4, provided that $2 \leq n+m \leq 5$, when m is an integer of 2 to 4, multiple Xs may be the same or different, and when n is an integer of 2 to 4, multiple $R_2$s may be the same or different.

The perfluoro group of $R_1$ is preferably a perfluoro-methyl group or a perfluoroethyl group. $R_1$ is preferably a hydrogen atom, a methyl group or a $C_mF_{2m+1}$ (m is preferably 1), more preferably a hydrogen atom or a methyl group.

$R_2$ represents a non-acid-decomposable group. The non-acid-decomposable group means a group which is not an acid-decomposable group (a group capable of decomposing under the action of an acid to generate an alkali-soluble group), that is, a group which does not produce an alkali-soluble group such as hydroxyl group and carboxyl group by decomposing under the action of an acid generated from a photo-acid generator or the like upon exposure.

Specific examples of the non-acid-decomposable group of $R_2$ include a halogen atom, an alkyl group, a cycloalkyl group, an aryl group, an alkoxy group, an acyl group, —OC(=O)Ra, —OC(=O)ORa, —C(=O)ORa, —C(=O)N(Rb)Ra, —N(Rb)C(=O)Ra, —N(Rb)C(=O)ORa, —N(Rb)SO$_2$Ra, —SRa, —SO$_2$Ra, —SO$_3$Ra and —SO$_2$N(Rb)Ra.

The alkyl group of $R_2$ may have a substituent and is, for example, an alkyl group having from 1 to 8 carbon atoms and specific preferred examples thereof include a methyl group, an ethyl group, a propyl group, an n-butyl group, a sec-butyl group, a hexyl group and an octyl group.

The cycloalkyl group of $R_2$ may have a substituent and is, for example, a cycloalkyl group having from 3 to 15 carbon atoms and specific preferred examples thereof include a cyclopentyl group, a cyclohexyl group, a norbornyl group and an adamantyl group.

The alkoxy group of $R_2$ may have a substituent and is, for example, an alkoxy group having from 1 to 8 carbon atoms and examples thereof include a methoxy group, an ethoxy group, a propoxy group, a butoxy group, a pentyloxy group, a hexyloxy group and a cyclohexyloxy group.

The aryl group of $R_2$ may have a substituent and is, for example, an aryl group having from 6 to 15 carbon atoms and specific preferred examples thereof include a phenyl group, a tolyl group, a naphthyl group and an anthryl group.

The acyl group of $R_2$ may have a substituent and is, for example, an acyl group having from 2 to 8 carbon atoms and specific preferred examples thereof include a formyl group, an acetyl group, a propanoyl group, a butanoyl group, a pivaloyl group and a benzoyl group.

Examples of the substituent which the above-described groups each may have include a hydroxyl group, a carboxyl group, a halogen atom (e.g., fluorine, chlorine, bromine, iodine) and an alkoxy group (e.g., methoxy, ethoxy, propoxy, butoxy). In the case of a cyclic structure, examples of the substituent further include an alkyl group (preferably having from 1 to 8 carbon atoms).

The alkyl group, cycloalkyl group and aryl group of Ra and Rb are the same as those described for $R_2$.

The organic group of X is preferably an organic group having from 1 to 40 carbon atoms and may be an acid-decomposable group or a non-acid-decomposable group.

Examples of the non-acid-decomposable group include the same organic groups as those for the non-acid-decomposable group of $R_2$ (since X is an organic group, a halogen atom is not included as the non-acid-decomposable group).

Other examples include an alkyl group, a cycloalkyl group, an alkenyl group, an aryl group, an alkyloxy group (excluding —O-tertiary alkyl group), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

The non-acid-decomposable group is preferably an acyl group, an alkylcarbonyloxy group, an alkyloxy group, a cycloalkyloxy group, an aryloxy group, an alkylamideoxy group or an alkylamide group, more preferably an acyl group, an alkylcarbonyloxy group, an alkyloxy group, a cycloalkyloxy group or an aryloxy group.

In the non-acid-decomposable group, the alkyl group is preferably an alkyl group having from 1 to 4 carbon atoms, such as methyl group, ethyl group, propyl group, n-butyl group, sec-butyl group and tert-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; the alkenyl group is preferably an alkenyl group having from 2 to 4 carbon atoms, such as vinyl group, propenyl group, allyl group and butenyl group; the aryl group is preferably an aryl group having from 6 to 14 carbon atoms, such as phenyl group, xylyl group, toluyl group, cumenyl group, naphthyl group and anthracenyl group; and the alkoxy group is preferably an alkoxy group having from 1 to 4 carbon atoms, such as methoxy group, ethoxy group, hydroxyethoxy group, propoxy group, hydroxypropoxy group, n-butoxy group, isobutoxy group and sec-butoxy group.

When the organic group of X is an acid-decomposable group, examples thereof include —C($R_{11a}$)($R_{12a}$)($R_{13a}$), —C($R_{14a}$)($R_{15a}$)(O$R_{16a}$) and —CO—OC($R_{11a}$)($R_{12a}$)($R_{13a}$).

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$, or two of $R_{14a}$, $R_{15a}$ and $R_{16a}$ may combine to form a ring.

Also, a group having an acid-decomposable group may be introduced by modification into X of formula (I). X having introduced thereinto an acid-decomposable group is, for example, represented by the following formula:

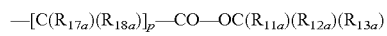

wherein $R_{17a}$ and $R_{18a}$ each independently represents a hydrogen atom or an alkyl group, and p represents an integer of 1 to 4.

The repeating unit represented by formula (I) is preferably a repeating unit represented by formula (Ia), more preferably a repeating unit represented by formula (Ib):

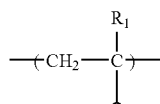

(Ia)

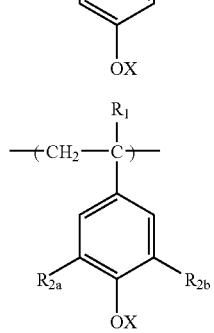

(Ib)

wherein $R_1$, $R_2$, X and n have the same meanings as those in formula (I).

In formula (Ib), $R_{2a}$ and $R_{2b}$ each is a hydrogen atom or a non-acid-decomposable group, provided that at least either one is a non-acid-decomposable group. The non-acid-decomposable group of $R_{2a}$ and $R_{2b}$ is the same as the non-acid-decomposable group of $R_2$ in formula (I).

The resin (A) preferably further contains a repeating unit represented by formula (II):

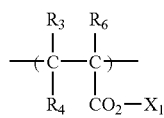

wherein $R_3$ to $R_5$ each independently represents a hydrogen atom, a fluorine atom, a chlorine atom, a cyano group or an alkyl group, and $X_1$ represents a hydrogen atom or an organic group.

The alkyl group of $R_3$ to $R_5$ is preferably an alkyl group having from 1 to 5 carbon atoms and examples thereof include a methyl group, an ethyl group and a propyl group.

The organic group of $X_1$ is preferably an organic group having from 1 to 40 carbon atoms and may be an acid-decomposable group or a non-acid-decomposable group.

Examples of the non-acid-decomposable group include the same organic groups for the non-acid-decomposable group of $R_2$ (since $X_1$ is an organic group, a halogen atom is not included as the non-acid-decomposable group).

Other examples include an alkyl group, a cycloalkyl group, an alkenyl group, an aryl group, an alkyloxy group (excluding —O-tertiary alkyl group), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

The non-acid-decomposable group is preferably an acyl group, an alkylcarbonyloxy group, an alkyloxy group, a cycloalkyloxy group, an aryloxy group, an alkylamideoxy group or an alkylamide group, more preferably an acyl group, an alkylcarbonyloxy group, an alkyloxy group, a cycloalkyloxy group or an aryloxy group.

In the non-acid-decomposable group, the alkyl group is preferably an alkyl group having from 1 to 4 carbon atoms, such as methyl group, ethyl group, propyl group, n-butyl group, sec-butyl group and tert-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; the alkenyl group is preferably an alkenyl group having from 2 to 4 carbon atoms, such as vinyl group, propenyl group, allyl group and butenyl group; the aryl group is preferably an aryl group having from 6 to 14 carbon atoms, such as phenyl group, xylyl group, toluyl group, cumenyl group, naphthyl group and anthracenyl group; and the alkoxy group is preferably an alkoxy group having from 1 to 4 carbon atoms, such as methoxy group, ethoxy group, hydroxyethoxy group, propoxy group, hydroxypropoxy group, n-butoxy group, isobutoxy group and sec-butoxy group.

When the organic group of X is an acid-decomposable group, examples thereof include —C($R_{11a}$) ($R_{12a}$) ($R_{13a}$), —C($R_{14a}$) ($R_{15a}$) (O$R_{16a}$) and —CO—OC($R_{11a}$) ($R_{12a}$) ($R_{13a}$).

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$, or two of $R_{14a}$, $R_{15a}$ and $R_{16a}$ may combine to form a ring.

Also, a group having an acid-decomposable group may be introduced by modification into $X_1$. $X_1$ having introduced thereinto an acid-decomposable group is, for example, represented by the following formula:

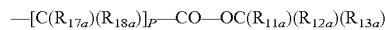
—[C($R_{17a}$)($R_{18a}$)]$_p$—CO—OC($R_{11a}$)($R_{12a}$)($R_{13a}$)

wherein $R_{17a}$ and $R_{18a}$ each independently represents a hydrogen atom or an alkyl group, and p represents an integer of 1 to 4.

The organic group of X or $X_1$ is preferably an acid-decomposable group having at least one cyclic structure selected from an alicyclic structure, an aromatic cyclic structure and a crosslinked alicyclic structure, and preferably has a structure containing an aromatic group (particularly phenyl group) or a structure containing an alicyclic or crosslinked alicyclic structure represented by any one of the following formulae (pI) to (pVI):

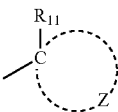

(pI)

-continued

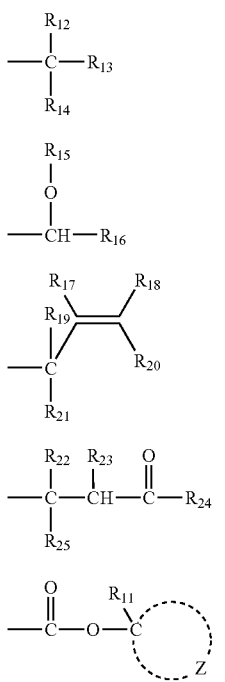

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_2$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a hydrogen atom, a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having from 1 to 4 carbon atoms, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may have include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z and the carbon atom each may be monocyclic or polycyclic. Specific examples thereof include a group having 5 or more carbon atoms and having a monocyclic, bicyclic, tricyclic or tetracyclic structure. The number of carbon atoms in the group is preferably from 6 to 30, more preferably from 7 to 25. These alicyclic hydrocarbon groups each may have a substituent.

Examples of the structure of the alicyclic moiety in the alicyclic hydrocarbon group are set forth below.

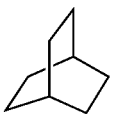 (28)

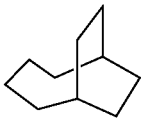 (29)

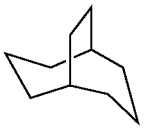 (30)

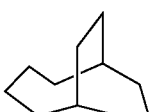 (31)

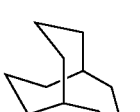 (32)

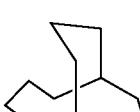 (33)

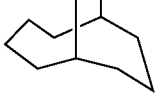 (34)

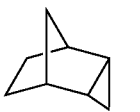 (35)

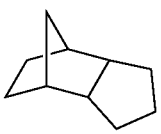 (36)

 (37)

-continued

(38) 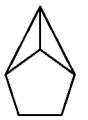

(39) 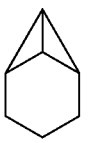

(40) 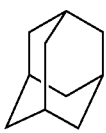

(41) 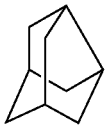

(42) 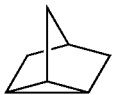

(43) 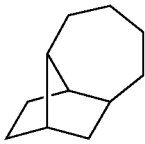

(44) 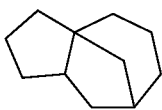

(45) 

(46) 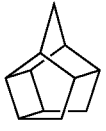

(47) 

(48) 

(49) 

(50) 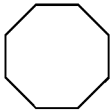

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having from 1 to 4 carbon atoms, such as methoxy group, ethoxy group, propoxy group and butoxy group.

The alkyl group, alkoxy group and alkoxycarbonyl group each may further have a substituent and examples of the substituent include an alkoxy group having from 1 to 4 carbon atoms (e.g., methoxy, ethoxy, butoxy), a hydroxy group, an oxo group, an alkylcarbonyl group (preferably having from 2 to 5 carbon atoms), an alkylcarbonyloxy group (preferably having from 2 to 5 carbon atoms), an alkyloxycarbonyl group (preferably having 2 to 5 carbon atoms) and a halogen atom (e.g., chlorine, bromine, fluorine).

In the resin (A), for maintaining good developability with an alkali developer, another appropriate polymerizable monomer where an alkali-soluble group such as phenolic hydroxyl group, carboxyl group, sulfonic acid group and hexafluoroisopropanol group ($-C(CF_3)_2OH$) can be introduced may be copolymerized or for enhancing the film property, another hydrophobic polymerizable monomer such as alkyl acrylate and alkyl methacrylate may be copolymerized.

A methacrylate or acrylate having a hydrophilic group such as alkyleneoxy and lactone may be copolymerized in order to adapt a hydrophilicity-hydrophobicity of the resin.

Other than those, styrene (which may be substituted by an alkyl group, a halogen atom, alkylthio group, sulfonyl group, ester group), vinylnaphthalene (which may be substituted by an alkyl group, a halogen atom, alkylthio group, sulfonyl group, ester group), vinylanthracene (which may be substituted by an alkyl group, a halogen atom, alkylthio group, sulfonyl group, ester group), acrylamides, methacrylamides, allyl compound, vinylethers, vinylesters or the like, may be copolymerized.

The content of the repeating unit represented by formula (I) is preferably from 3 to 95 mol %, more preferably from 5 to 90 mol %, still more preferably from 10 to 85 mol %, based on all repeating units constituting the resin.

The content of the repeating unit represented by formula (II) is preferably from 1 to 99 mol %, more preferably from 5 to 90 mol %, still more preferably from 10 to 85 mol %, based on all repeating units constituting the resin.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the resin.

The content of the repeating unit having an acid-decomposable group is preferably from 3 to 95 mol %, more preferably from 5 to 90 mol %, still more preferably from 10 to 85 mol %, based on all repeating units constituting the resin.

The resin can be synthesized by a known synthesis method such as a method of reacting an alkali-soluble resin with a precursor of a group capable of decomposing under the action of an acid, described in European Patent 254,853, JP-A-2-258500, JP-A-3-223860 and JP-A-251259, or a method of copolymerizing a monomer capable of decomposing under the action of an acid with various monomers.

The weight average molecular weight (Mw) of the resin is preferably from 1,000 to 200,000, more preferably from 1,500 to 100,000, still more preferably from 2,000 to 50,000. If the weight average molecular weight is less than 1,000, the unexposed area may not be prevented from film loss and therefore, the weight average molecular weight is preferably 1,000 or more. Also, in view of dissolution rate of the resin itself in an alkali and sensitivity, the weight average molecular weight is preferably 200,000 or less. The molecular weight dispersity (Mw/Mn) is preferably from 1.0 to 4.0, more preferably from 1.0 to 3.0, still more preferably from 1.0 to 2.5.

The weight average molecular weight as used herein is defined by the polystyrene-reduced value according to gel permeation chromatography.

The resins (A) may be used in combination of two or more thereof.

The amount in total of the resin (A) added is usually from 30 to 99 mass %, preferably from 40 to 97 mass %, more preferably from 50 to 95 mass %, based on the solid content of the positive resist.

Specific examples of the resin are described in Examples, but the present invention is not limited thereto.

In addition, as specific examples of the repeating unit represented by the formula (I) or (II), those in the resins described in Examples can be exemplified, but the present invention is not limited thereto.

[2] (B) A Compound Capable of Generating an Acid Upon Irradiation with Actinic Rays or Radiation The compound capable of generating an acid upon irradiation with actinic rays or radiation, such as X-ray, electron beam, ion beam and EUV, which is used in the positive resist composition of the present invention, is described below (hereinafter, this compound is sometimes called an "acid generator").

As for the acid generator usable in the present invention, a photoinitiator for photocationic polymerization, a photoinitiator for photoradical polymerization, a photo-decoloring agent for dyes, a photo-discoloring agent, a known compound capable of generating an acid upon irradiation with actinic rays or radiation used for microresist and the like, or a mixture thereof may be appropriately selected and used.

Examples thereof include onium salts such as diazonium salt, ammonium salt, phosphonium salt, iodonium salt, sulfonium salt, selenonium salt and arsonium salt, organic halogen compounds, organic metals/organic halides, photo-acid generators having an o-nitrobenzyl-type protective group, compounds capable of photolyzing to generate a sulfonic acid, as represented by iminosulfonate, and disulfone compounds.

Also, compounds in which a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds of generating an acid under the action of light described, for example, in U.S. Pat. No. 3,779,778 and European Patent 126,712 may also be used.

Among these usable compounds of decomposing upon irradiation with actinic rays or radiation to generate an acid, particularly effective compounds are described below.

(1) Iodonium salt represented by the following formula (PAG1) and sulfonium salt represented by formula (PAG2):

In these formulae, $Ar^1$ and $Ar^2$ each independently represents an aryl group. Preferred examples of the substituent for the aryl group include an alkyl group, a cycloalkyl group, an aryl group, an alkoxy group, a nitro group, a carboxyl group, an alkoxycarbonyl group, a hydroxy group, a mercapto group and a halogen atom.

$R^{201}$, $R^{202}$ and $R^{203}$ each independently represents an alkyl group or an aryl group, preferably an aryl group having from 6 to 14 carbon atoms, an alkyl group having from 1 to 8 carbon atoms, or a substitution derivative thereof.

Preferred examples of the substituent for the aryl group include an alkoxy group having from 1 to 8 carbon atoms, an alkyl group having from 1 to 8 carbon atoms, a nitro group, a carboxyl group, a hydroxy group and a halogen atom, and preferred examples of the substituent for the alkyl group include an alkoxy group having from 1 to 8 carbon atoms, a carboxyl group and an alkoxycarbonyl group.

$Z^-$ represents a non-nucleophilic anion and examples thereof include, but are not limited to, $BF_4^-$, $AsF_6^-$, $PF_6^-$, $SbF_6^-$, $SiF_6^{2-}$, $ClO_4^-$, perfluoroalkanesulfonate anion (e.g., $CF_3SO_3^-$), pentafluorobenzenesulfonate anion, substituted benzenesulfonate anion, condensed polynuclear aromatic sulfonate anion (e.g., naphthalene-1-sulfonate anion), anthraquinonesulfonate anion, sulfonic acid group-containing dyes, perfluoroalkylcarboxylate anion, alkyl-carboxylate anion and benzoate anion.

Two of $R^{201}$, $R^{202}$ and $R^{203}$, or $Ar^1$ and $Ar^2$ may be combined through a single bond or a substituent.

Specific examples of these onium salts include, but are not limited to, the following compounds: diphenyliodonium dodecylbenzenesulfonate, diphenyliodonium trifluoromethanesulfonate, bis(4-trifluoromethylphenyl)-iodonium trifluoromethanesulfonate, bis(4-tert-butylphenyl)iodonium triflouromethaesulfonate, bis(4-tertbutylphenyl)iodonium camphorsulfonate, triphenylsulfonium dodecylbenzenesulfonate, triphenylsulfonium-2,4,6-trimethylbenzenesulfonate, triphenylsulfonium-2,4,6-triisopropylbenzenesulfonate, triphenylsulfonium trifluoromethanesulfonate, triphenylsulfonium perfluorooctanesulfonate, triphenylsulfonium perfluorononanesulfonate, triphenylsulfonium camphorsulfonate, triphenylsulfonium perfluorobenzene-sulfonate and triphenylsulfonium-3,4-bis(trifluoromethyl)benzenesulfonate.

The onium salts represented by formulae (PAG1) and (PAG2) are known and can be synthesized by the method described, for example, in U.S. Pat. Nos. 2,807,648 and 4,247,473 and JP-A-53-101331.

Specific examples of the acid generators represented by formulae (PAG1) and (PAG2) other than those described above are set forth below.

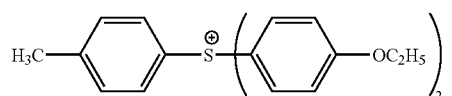
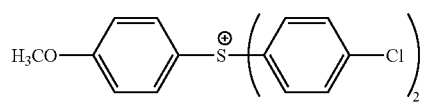
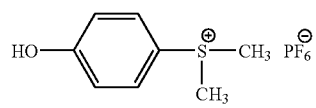

(PEG4-10)

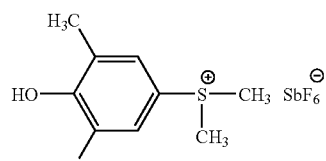
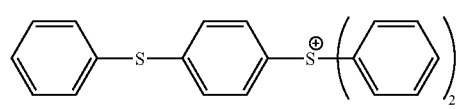
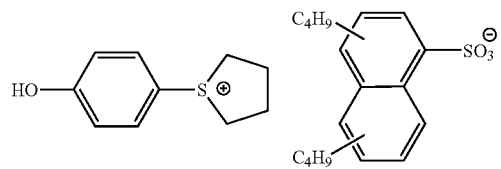
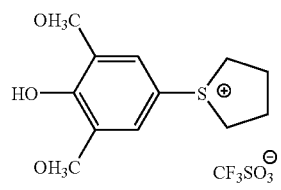

-continued

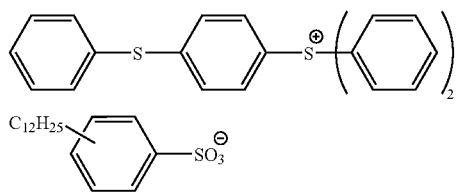
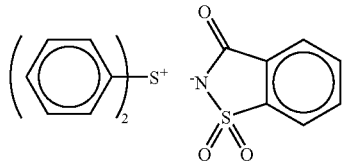
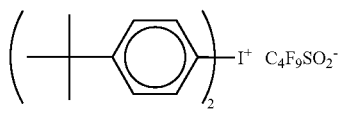
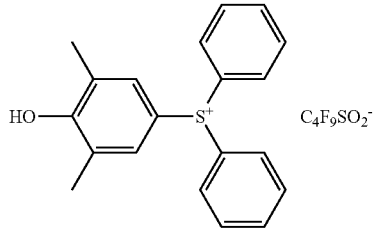
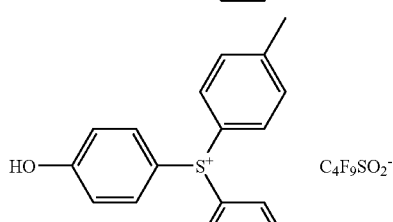
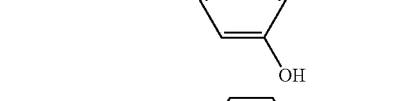
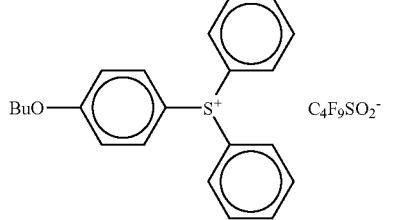
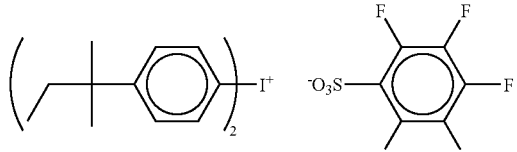
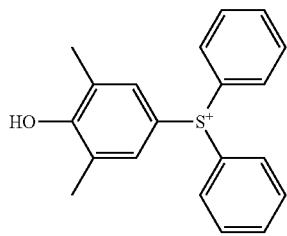

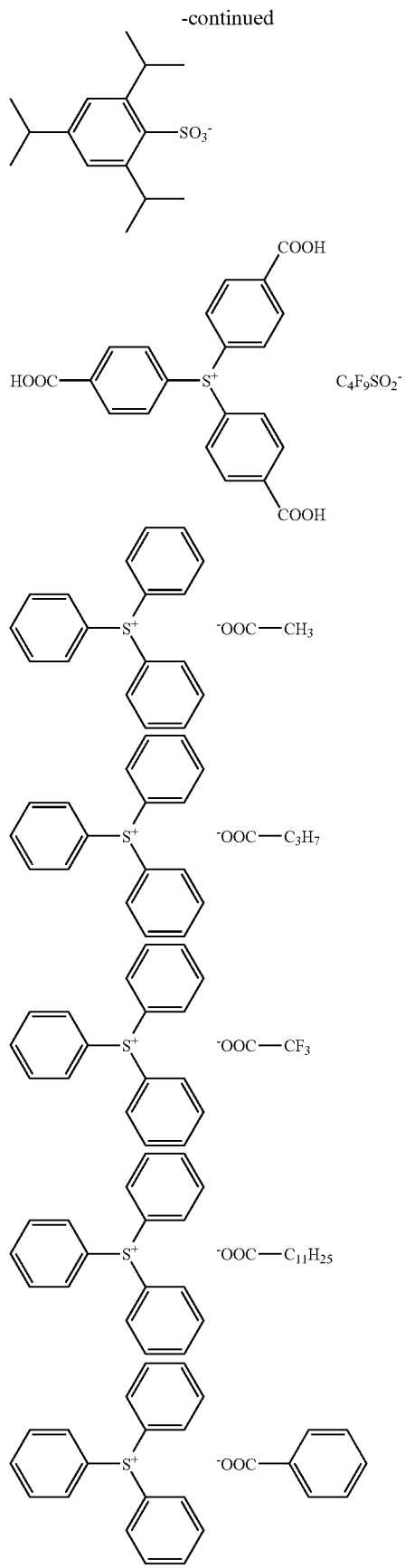

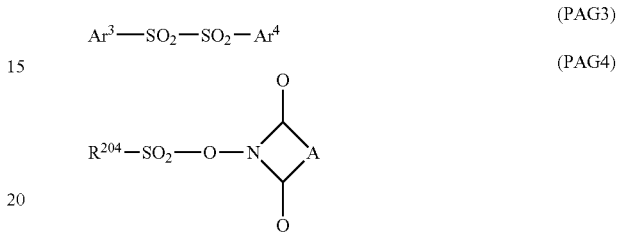

(2) Disulfone derivative represented by the following formula (PAG3) and iminosulfonate derivative represented by formula (PAG4):

$$Ar^3-SO_2-SO_2-Ar^4 \quad (PAG3)$$

(PAG4)

wherein $Ar^3$ and $Ar^4$ each independently represents an aryl group, $R^{204}$ represents an alkyl group or an aryl group, and A represents an alkylene group, an alkenylene group or an arylene group.

Specific examples thereof include, but are not limited to, the following compounds: bis(tolyl)disulfone, bis(4-methoxyphenyl)disulfone, bis(4-trifluoromethylphenyl)disulfone, phenyl-4-isopropylphenyl-disulfone,

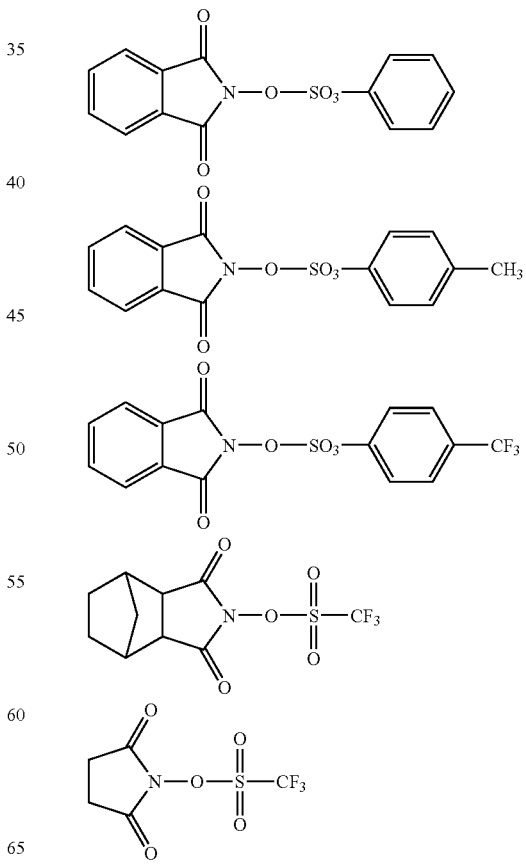

(3) Diazodisulfone derivative represented by the following formula (PAG5)

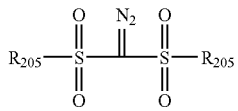

(PAG5)

wherein each $R_{205}$ independently represents an alkyl group, a cycloalkyl group or an aryl group.

Specific examples thereof include, but are not limited to, the following compounds:
bis(phenylsulfonyl)diazomethane, bis(2,4-dimethylphenyl-sulfonyl)diazomethane, bis(cyclohexylsulfonyl)diaz-omethane, bis(tolylsulfonyl)diazomethane and bis(tert-butylsulfonyl)-diazomethane.

(4) Also, a phenacylsulfonium derivative represented by the following formula (PAG6) may be used as the acid generator.

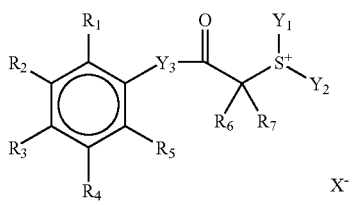

(PAG6)

wherein $R_1$ to $R_5$ each represents a hydrogen atom, an alkyl group, a cycloalkyl group, an alkoxy group, a nitro group, a halogen atom, an alkyloxycarbonyl group or an aryl group, at least two or more of $R_1$ to $R_5$ may combine to form a ring structure, $R_6$ and $R_7$ each represents a hydrogen atom, an alkyl group, a cycloalkyl group, a cyano group or an aryl group, $Y_1$ and $Y_2$ each represents an alkyl group, a cycloalkyl group, an aryl group, an aralkyl group or an aromatic group containing a heteroatom, $Y_1$ and $Y_2$ may combine to form a ring, $Y_3$ represents a single bond or a divalent linking group, $X^-$ has the same meaning as $Z^-$ in (PAG1), and at least one of $R_1$ to $R_5$ and at least one of $Y_1$ and $Y_2$ may combine to form a ring, or at least one of $R_1$, to $R_5$ and at least one of $R_6$ and $R_7$ may combine to form a ring.

The compound may have two or more structures of (PAG6) by combining these at any position of $R_1$ to $R_7$, $Y_1$, and $Y_2$ through a linking group.

Specific examples of the compound represented by (PAG6) are set forth below, but the present invention is not limited thereto.

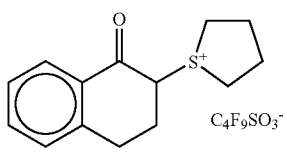

(I-1)

$C_4F_9SO_3^-$

-continued

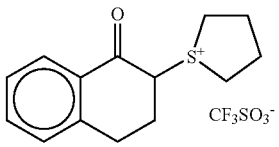

(I-2)

$CF_3SO_3^-$

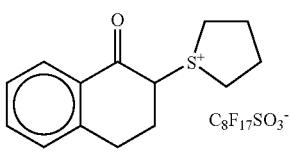

(I-3)

$C_8F_{17}SO_3^-$

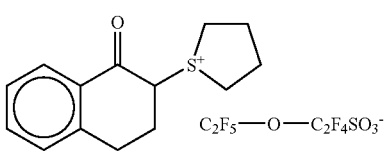

(I-4)

$C_2F_5-O-C_2F_4SO_3^-$

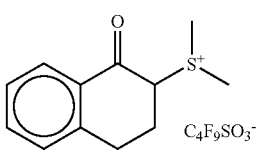

(I-5)

$C_4F_9SO_3^-$

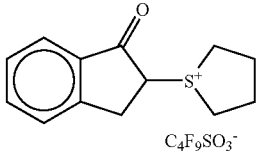

(I-6)

$C_4F_9SO_3^-$

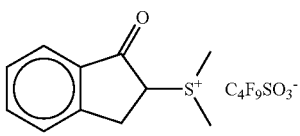

(I-7)

$C_4F_9SO_3^-$

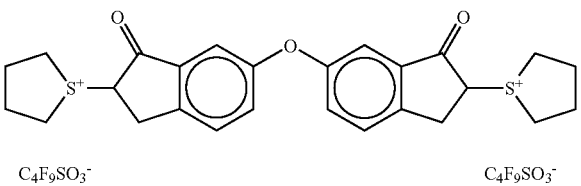

(I-8)

$C_4F_9SO_3^-$ $C_4F_9SO_3^-$

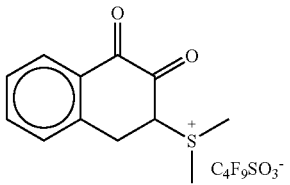

(I-9)

$C_4F_9SO_3^-$

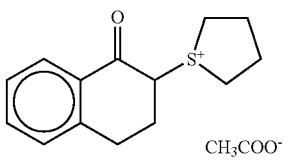

(I-10)

$CH_3COO^-$

-continued
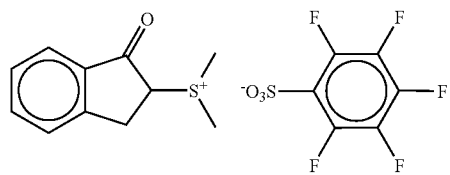
(I-11)
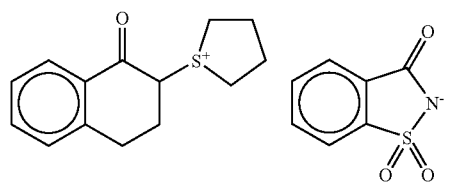
(I-12)
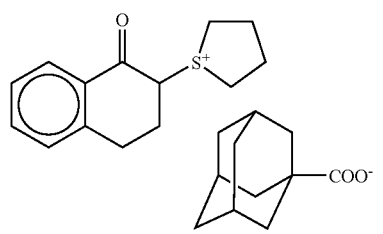
(I-13)
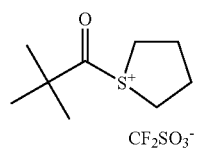
(I-14)
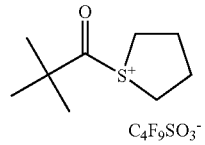
(I-15)
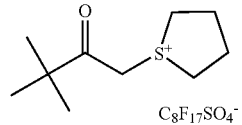
(I-16)
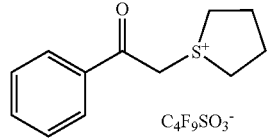
(I-17)
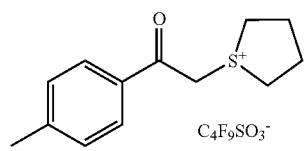
(I-18)
-continued
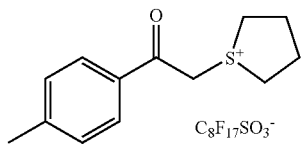
(I-19)
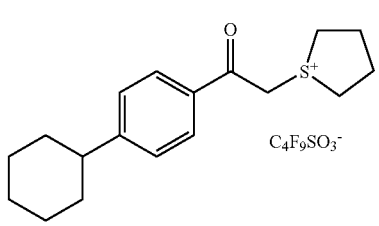
(I-20)
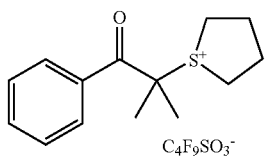
(I-21)
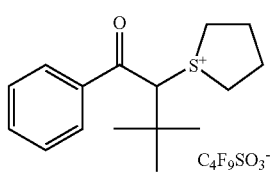
(I-22)
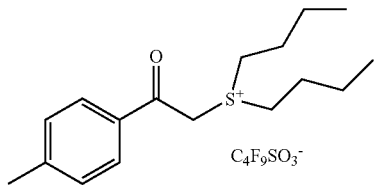
(I-23)
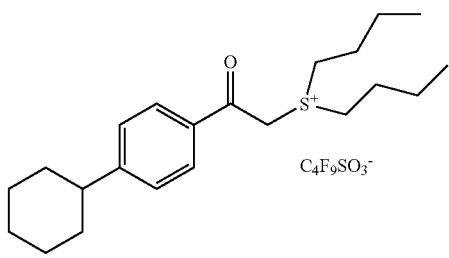
(I-24)
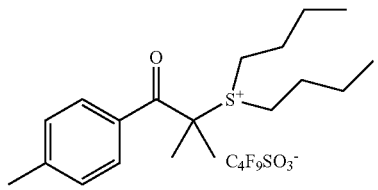
(I-25)

Other examples of the acid generator are set forth below.

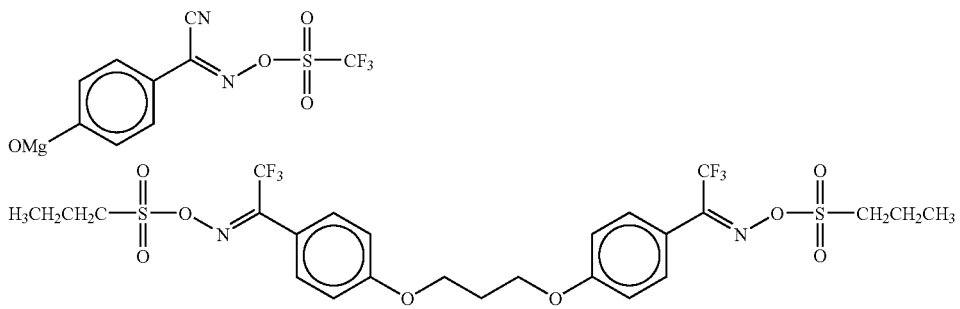

Among these acid generators, preferred are compounds represented by formulae (PAG1), (PAG2) and (PAG6), more preferred are compounds represented by formulae (PAG1) and (PAG2).

Also, a compound capable of generating an organic sulfonic acid under the action of actinic rays or radiation [hereinafter, this compound is sometimes called a "component (B1)"] is preferred. Examples of the component (B1) include those where the counter anion $Z^-$ in formulae (PAG1), (PAG2) and (PAG6) is a sulfonate anion.

In addition to the compound (B1), a compound capable of generating a carboxylic acid under the action of actinic rays or radiation [hereinafter, this compound is sometimes called a "component (B2)"] is preferably further contained as the component (B). By using the components (B1) and (B1) in combination, various performances such as sensitivity and resolution can be enhanced. Examples of the component (B2) include those where the counter anion $Z^-$ in formulae (PAG1), (PAG2) and (PAG6) is a carboxylate anion.

The mass ratio of component (B1)/component (B2) is usually from 1/1 to 100/1, preferably from 1/1 to 10/1.

One of the compounds of the component (B1) or (B2) may be used alone or two or more thereof may be used in combination.

The amount added of the compound capable of decomposing upon irradiation with actinic rays or radiation to generate an acid is, in terms of a total amount, usually from 0.001 to 40 mass %, preferably from 0.01 to 20 mass %, more preferably from 0.1 to 10 mass %, based on the solid content in the composition. The amount added of the compound capable of decomposing upon irradiation with actinic rays or radiation to generate an acid is preferably 0.001 mass % or more in view of sensitivity and preferably 40 mass % or less in view of film shape and profile.

[3] Organic Basic Compound (C)

The organic basic compound contained in the resist composition of the present invention is preferably a compound having a basicity stronger than phenol. The molecular weight of the organic basic compound is usually from 100 to 900, preferably from 150 to 800, more preferably from 200 to 700. In particular, a nitrogen-containing basic compound is preferred.

As for the preferred chemical environment of the nitrogen-containing basic compound, a compound having any one structure of the following formulae (A) to (E) is preferred. The structures of formulae (B) to (E) each may form a part of a ring structure.

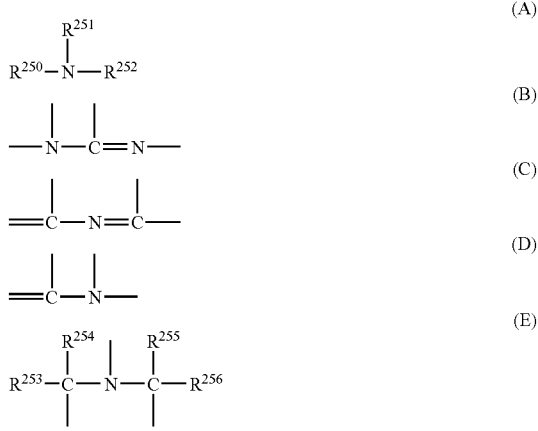

In these formulae, $R^{250}$, $R^{251}$ and $R^{252}$, which may be the same or different, each represents a hydrogen atom, an alkyl group having from 1 to 20 carbon atoms, a cycloalkyl group having from 1 to 20 carbon atoms or a substituted or unsubstituted aryl group having from 6 to 20 carbon atoms, and $R^{251}$ and $R^{252}$ may combine with each other to form a ring.

The alkyl group may or may not have a substituent. The alkyl group having a substituent is preferably an aminoalkyl group having from 1 to 6 carbon atoms or a hydroxyalkyl group having from 1 to 6 carbon atoms.

$R^{253}$, $R^{254}$, $R^{255}$ and $R^{256}$ which may be the same or different, each represents an alkyl group having from 1 to 6 carbon atoms.

The compound is more preferably a nitrogen-containing basic compound having two or more nitrogen atoms differing in the chemical environment within one molecule, still more preferably a compound containing both a substituted or unsubstituted amino group and a ring structure containing a nitrogen atom, or a compound containing an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methyl-pyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

A tetraalkylammonium salt-type nitrogen-containing basic compound can also be used. In particular, a tetraalkylammonium hydroxide having from 1 to 8 carbon atoms, such as tetramethylammonium hydroxide, tetraethyl-ammonium hydroxide, tetra-(n-butyl)ammonium hydroxide, is preferred. These nitrogen-containing basic compounds are used individually or in combination of two or more thereof.

The ratio of the acid generator and the organic basic compound used in the composition is preferably acid generator/organic basic compound (by mol)=2.5 to 300. That is, the molar ratio is preferably 2.5 or more in view of sensitivity and resolution and preferably 300 or less from the standpoint of preventing the resolution from decreasing due to thickening of the resist pattern in aging after exposure until heat treatment. The ratio of acid generator/organic basic compound (by mol) is more preferably from 5.0 to 200, still more preferably from 7.0 to 150.

[4] Surfactants

In the present invention, surfactants can be used and use thereof is preferred in view of film-forming property, adhesion of pattern, reduction in development defects, and the like.

Specific examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine-containing or silicon-containing surfactants such as EFtop EF301, EF303, EF352 (produced by Shin Akita Chemical Co., Ltd.), Megafac F171, F173 (produced by Dainippon Ink & Chemicals, Inc.), Florad FC430, FC431 (produced by Sumitomo 3M Inc.), Asahiguard AG710, Surflon S-382, SC101, SC102, SC103, SC104, SC105 and SC106 (produced by Asahi Glass Co., Ltd.) and Troysol S-366 (produced by Troy Chemical Industries, Inc.); organosiloxane polymer KP-341 (produced by Shin-Etsu Chemical Co., Ltd.); and acrylic acid-based or methacrylic acid-based (co)polymer Polyflow No. 75 and No. 95 (produced by Kyoeisha Yushi Kagaku Kogyo). The amount of the surfactant blended is usually 2 parts by mass or less, preferably 1 part by mass or less, per 100 parts by mass of the solid content in the composition of the present invention.

These surfactants may be used individually or some of these may be added in combination.

As for the surfactant, the composition preferably contains any one fluorine- and/or silicon-containing surfactant (a fluorine-containing surfactant, a silicon-containing surfactant or a surfactant containing both a fluorine atom and a silicon atom), or two or more thereof.

Examples of such surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as-is.

Examples of the commercially available surfactant which can be used include fluorine-containing or silicon-containing surfactants such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, polysiloxane polymer KP-341 (produced by Shin-Etsu Chemical Co., Ltd.) may also be used as a silicon-containing surfactant.

Other than those known surfactants, surfactants using a polymer having a fluoro-aliphatic group which is derived from a fluoro-aliphatic compound produced by telomerization (also called telomer process) or oligomerization (also called oligomer process) may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate and the polymer may have an irregular distribution or may be a block copolymer. Examples of the poly(oxyalkylene) group include a poly(oxy-ethylene) group, a poly(oxypropylene) group and a poly(oxy-butylene) group. This group may also be a unit having alkylenes differing in the chain length within the same chain, such as block-linked poly(oxyethylene, oxypropylene, oxyethylene) and block-linked poly(oxyethylene, oxy-propylene). Furthermore, the copolymer of a fluoro-aliphatic group-containing monomer and a (poly(oxy-alkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), copolymers of an acrylate (or methacrylate) having $C_6F_{13}$ group and a (poly(oxyalkylene))acrylate (or methacrylate), copolymers of an acrylate (or methacrylate) having $C_6F_{13}$ group, a (poly(oxyethylene))acrylate (or methacrylate) and a (poly(oxypropylene))acrylate (or methacrylate), copolymers of an acrylate (or methacrylate) having $C_8F_{17}$ group and a (poly(oxyalkylene))acrylate (or methacrylate), and copolymers of an acrylate (or methacrylate) having $C_8F_{17}$ group, a (poly(oxyethylene))acrylate (or methacrylate) and a (poly(oxypropylene))acrylate (or methacrylate).

The amount of the surfactant used is preferably from 0.0001 to 2 mass %, more preferably from 0.001 to 1 mass %, based on the entire amount of the positive resist composition (excluding solvent).

[7] Other Components

The positive resist composition of the present invention may further contain, if desired, a dye, a photo-base generator and the like.

1. Dye

In the present invention, a dye can be used.

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photo-Base Generator

Examples of the photo-base generator which can be added to the composition of the present invention include the compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator which can be suitably used include 2-nitrobenzyl carbamate, 2,5-dinitrobenzyl-cyclohexyl carbamate, N-cyclohexyl-4-methylphenylsulfon-amide and 1,1-dimethyl-2-phenylethyl-N-isopropyl carbamate. The photo-base generator is added for the purpose of improving the resist profile or the like.

3. Solvents

The resist composition of the present invention is dissolved in a solvent which can dissolve respective components described above, and then coated on a support. Usually, the solid content concentration of the entire resist composition component is preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran. These solvents are used individually or in combination of two or more thereof.

The resist composition of the present invention is coated on a substrate to form a thin film. The thickness of this resist film is preferably from 0.05 to 4.0 μm.

In the present invention, a commercially available inorganic or organic antireflection film may be used, if desired. Furthermore, an antireflection film may be used by coating it as a lower layer of the resist.

The antireflection film used as the lower layer of the resist may be either an inorganic film such as titanium, titanium dioxide, titanium nitride, chromium oxide, carbon and amorphous silicon, or an organic film comprising a light absorbent and a polymer material. The former requires equipment for the film formation, such as vacuum vapor-deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film comprising a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series, DUV-40 Series (produced by Brewer Science, Inc.), AR-2, AR-3 and AR-5 (produced by Shipley Co., Ltd.).

For example, in the production of a precision integrated circuit device, the step of forming a pattern on a resist film is performed by coating the positive resist composition of the present invention on a substrate (for example, silicon/silicon dioxide-coated substrate, glass substrate, ITO substrate or quartz/chromium oxide-coated substrate), drying it to form a resist film, irradiating X-ray, electron beam, ion beam or EUV thereon, preferably heating it, and then subjecting the resist film to development, rinsing and drying, whereby a good resist pattern can be formed.

The alkali developer which can be used for the resist composition of the present invention is an aqueous solution (usually from 0.1 to 20 mass %) of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethyl-ammonium hydroxide, choline) and cyclic amines (e.g., pyrrole, piperidine). In this aqueous solution of an alkali, an alcohol such as isopropyl alcohol and a surfactant such as nonionic surfactant may be added each in an appropriate amount.

Among these developers, preferred are quaternary ammonium salts, more preferred are tetramethylammonium hydroxide and choline.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

Synthesis Example 1

Synthesis of Polymer 1a

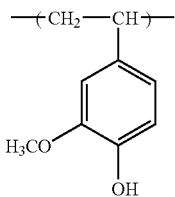

In a reaction vessel, 192.2 g (1.0 mol) of 3-methoxy-4-acetoxystyrene (produced by Honshu Chemical Industry Co., Ltd.) was dissolved in 400 ml of tetrahydrofuran. A nitrogen gas was then passed into the system with stirring. Thereto, 23.03 g (0.1 mol) of polymerization initiator V-601 (produced by Wako Pure Chemical Industries, Ltd.) was added and the reaction solution was heated at 65° C. After stirring under heat for 10 hours, the reaction solution was allowed to cool to room temperature and then added dropwise in 5 L of hexane to precipitate a polymer. The solid obtained by filtration was dissolved in 300 ml of acetone and again added dropwise in 5 L of hexane and after filtration, the solid obtained was dried under reduced pressure to obtain 169.14 g of a 3-methoxy-4-acetoxystyrene homopolymer.

In a reaction vessel, 153.77 g of the polymer obtained above, 500 ml of methanol, 500 ml of 1-methoxy-2-propanol, 2.0 ml of concentrated hydrochloric acid and 30 ml of distilled water were added and heated at 80° C., followed by stirring for 5 hours. The reaction solution was allowed to cool to room temperature and added dropwise in 5 L of distilled water. The solid obtained by filtration was dissolved in 800 ml of acetone and again added dropwise in 5 L of distilled water and after filtration, the solid obtained was dried under reduced pressure to obtain 110.53 g of Polymer 1a. The weight average molecular weight by GPC was 8,000 and the molecular weight dispersity (Mw/Mn) was 1.56.

Synthesis Example 2

Synthesis of Polymer 1b

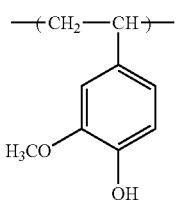

In a reaction vessel, 222.3 g (10 mol) of 3-methoxy-4-(1-ethoxyethoxy) purified by distillation was dissolved in 500 ml of dehydrated tetrahydrofuran. A nitrogen gas was then passed into the system with stirring and the system was cooled to −78° C. Thereto, 0.02 mol of n-butyl lithium was added to initiate the polymerization. The polymerization degree was confirmed by sampling a part of the reaction solution every 30 minutes. When reached a desired polymerization degree, the polymerization was stopped by adding methanol to the reaction solution. After waiting until the reaction solution was cooled to room temperature, the reaction solution was added dropwise in 5 L of methanol to precipitate a polymer. The solid obtained by filtration was dissolved in 300 ml of acetone and again added dropwise in 5 L of methanol and after filtration, the solid obtained was dried under reduced pressure to obtain 173.38 g of a 3-methoxy-4-(1-ethoxyethoxy)styrene homopolymer.

In a reaction vessel, 155.6 g of the polymer obtained above, 700 ml of tetrahydrofuran, 300 ml of methanol, 20 ml of distilled water and 1.0 g of p-toluenesulfonic acid were added and stirred at room temperature for 5 hours. Thereafter, the reaction solution was added dropwise in 4 L of distilled water. The solid obtained by filtration was dissolved in 300 ml of acetone and again added dropwise in 5 L of distilled water and after filtration, the solid obtained was dried under reduced pressure to obtain 93.56 g of Polymer 1b. The weight average molecular weight by GPC was 8,000 and the molecular weight dispersity was 1.07.

The raw material 3-methoxy-4-(1-ethoxyethoxy)styrene can be synthesized by deprotecting the acetyl group of 4-methoxy-4-acetoxystyrene (produced by Honshu Chemical Industry Co., Ltd.) in a usual manner and then protecting the phenolic OH with an ethyl vinyl ether in a usual manner.

Synthesis Example 3

Synthesis of Polymer A-1

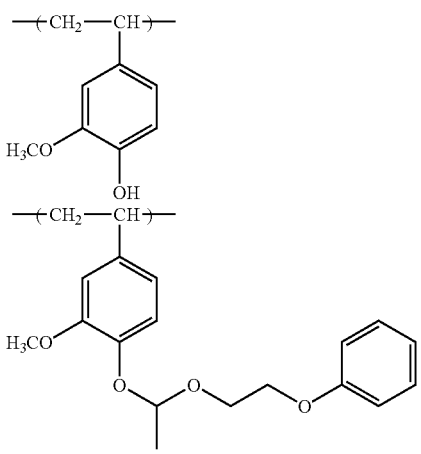

In a reaction vessel, 30 g of Polymer 1a obtained in Synthesis Example 1 or Polymer 1b obtained in Synthesis Example 2 was dissolved in 100 g of PGMEA. The resulting solution was depressurized to 20 mmHg at 60° C. to remove by distillation about 20 g of the solvent together with water remaining in the system. After cooling to 20° C., 3.94 g of 2-phenoxyethyl vinyl ether and 1.0 g of p-toluenesulfonic acid were added and stirred at room temperature for 1 hour. Thereafter, 1.16 g of triethylamine was added to effect neutralization and then, a washing operation was performed three times by adding 40 g of ethyl acetate and 40 g of water. Subsequently, the amount of the solvent was adjusted to obtain a polymer solution of 30 mass %. The polymers obtained are designated as A-1a and A-1b, respectively. In Polymer A-1a, the weight average molecular weight by GPC was 8,600, the molecular weight dispersity was 1.56 and from 1H and 13C-NMR analyses, the acetal protection rate of phenolic OH was 11.3%. In Polymer A-1b, the weight average molecular weight by GPC was 8,400, the molecular weight dispersity was 1.07 and from 1H and 13C-NMR analyses, the acetal protection rate of phenolic OH was 11.6%.

Polymers A-2 to A-12 were obtained in the same manner as in Synthesis Examples 1, 2 and 3 except for changing the monomer used to a vinyl ether.

Synthesis Example 4

Synthesis (1) of Polymer A-13

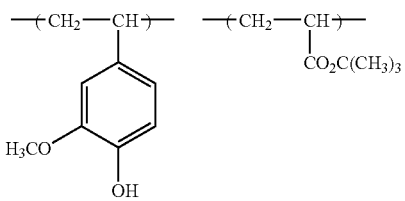

In a reaction vessel, 19.22 g (0.1 mol) of 3-methoxy-4-acetoxystyrene (produced by Honshu Chemical Industry Co., Ltd.) and 6.92 g (0.054 mol) of tert-butyl acrylate were dissolved in 60 ml of tetrahydrofuran. A nitrogen gas was then passed into the system with stirring. Thereto, 2.76 g (0.012 mol) of polymerization initiator V-601 (produced by Wako Pure Chemical Industries, Ltd.) was added and the reaction solution was heated at 65° C. After stirring under heat for 10 hours, the reaction solution was allowed to cool to room temperature and then added dropwise in 500 mL of hexane to precipitate a polymer. The solid obtained by filtration was dissolved in 40 ml of acetone and again added dropwise in 500 mL of hexane and after filtration, the solid obtained was dried under reduced pressure to obtain 22.74 g of a polymer.

In a reaction vessel, 20 g of the polymer obtained above, 100 ml of tetrahydrofuran, 30 ml of methanol, 500 ml of distilled water and 12.7 g of tetramethylammonium hydroxide were added and stirred for 5 hours with refluxing under heat. The reaction solution was allowed to cool to room temperature and added dropwise in 500 mL of distilled water. The solid obtained by filtration was dissolved in 40 ml of acetone and again added dropwise in 500 mL of distilled water and after filtration, the solid obtained was dried under reduced pressure to obtain 12.7 g of Polymer A-13. The weight average molecular weight by GPC was 9,600 and the molecular weight dispersity was 1.38. Also, from 1H and 13C-NMR analyses, the compositional ratio of 3-methoxy-4-hydroxystyrene/tert-butyl acrylate was 65.4/34.6.

Synthesis Example 5

Synthesis (2) of Polymer A-13

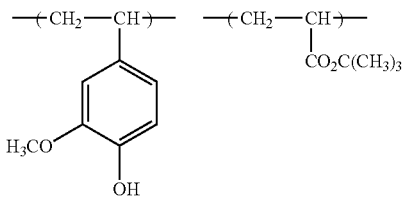

In a reaction vessel, 22.23 g (0.1 mol) of 3-methoxy-4-(1-ethoxyethoxy)styrene and 6.92 g (0.054 mol) of tert-butyl acrylate were dissolved in 60 ml of tetrahydrofuran. A nitrogen gas was then passed into the system with stirring. Thereto, 2.76 g (0.012 mol) of polymerization initiator V-601 (produced by Wako Pure Chemical Industries, Ltd.) was added and the reaction solution was heated at 65° C. After stirring under heat for 10 hours, the reaction solution was allowed to cool to room temperature and then added dropwise in 500 mL of hexane to precipitate a polymer. The solid obtained by filtration was dissolved in 40 ml of acetone and again added dropwise in 500 mL of hexane and after filtration, the solid obtained was dried under reduced pressure to obtain 22.15 g of a polymer.

In a reaction vessel, 20 g of the polymer obtained above, 100 ml of tetrahydrofuran, 30 ml of methanol, 5 ml of distilled water and 1.0 g of p-toluenesulfonic acid were added and stirred at room temperature for 5 hours. Thereafter, the reaction solution was added dropwise in 500 mL of distilled water. The solid obtained by filtration was dissolved in 40 ml of acetone and again added dropwise in 500 mL of distilled water and after filtration, the solid obtained was dried under reduced pressure to obtain 11.2 g of Polymer A-13. The weight average molecular weight by GPC was 9,600 and the molecular weight dispersity was 1.38. Also, from 1H and 13C-NMR analyses, the compositional ratio of 3-methoxy-4-hydroxystyrene/tert-butyl acrylate was 65.4/34.6.

Polymers A-14 to A-26 were obtained in the same manner as in Synthesis Examples 4 and 5 except for changing the monomer used.

Structures of Polymers A-1 to A-26 are shown below.

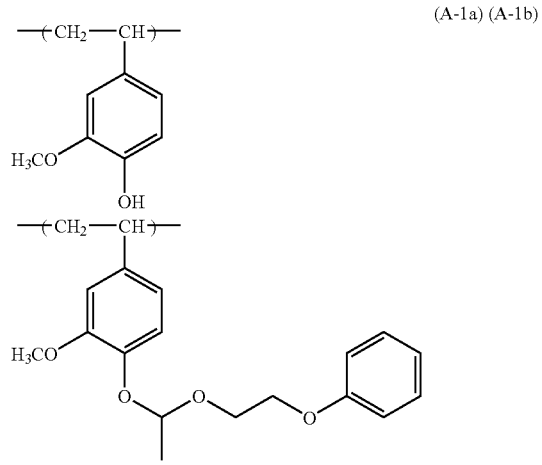

(A-1a) (A-1b)

-continued
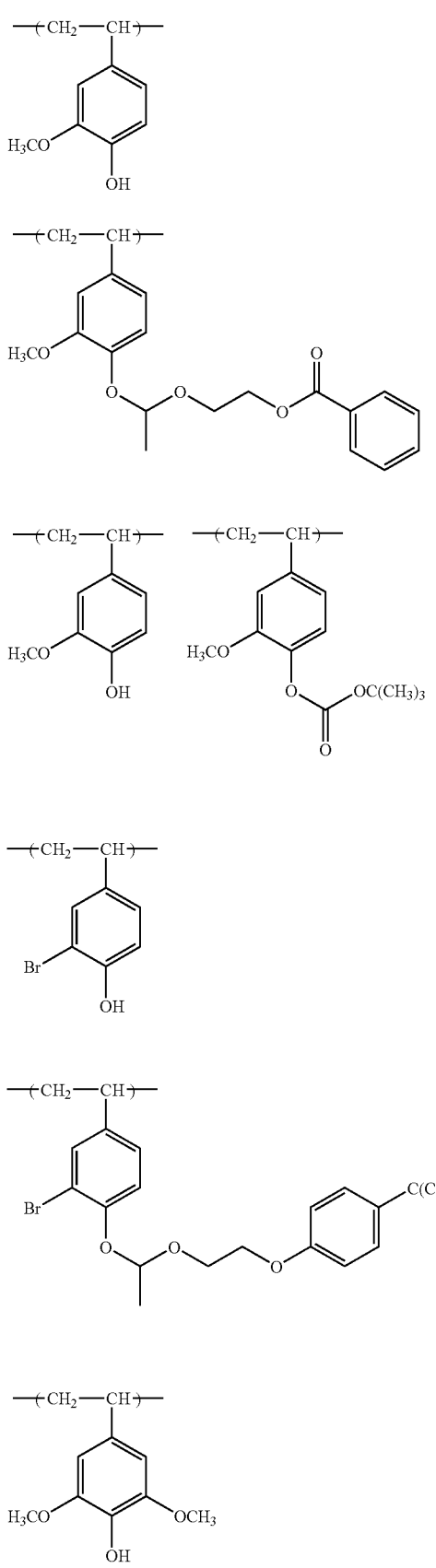
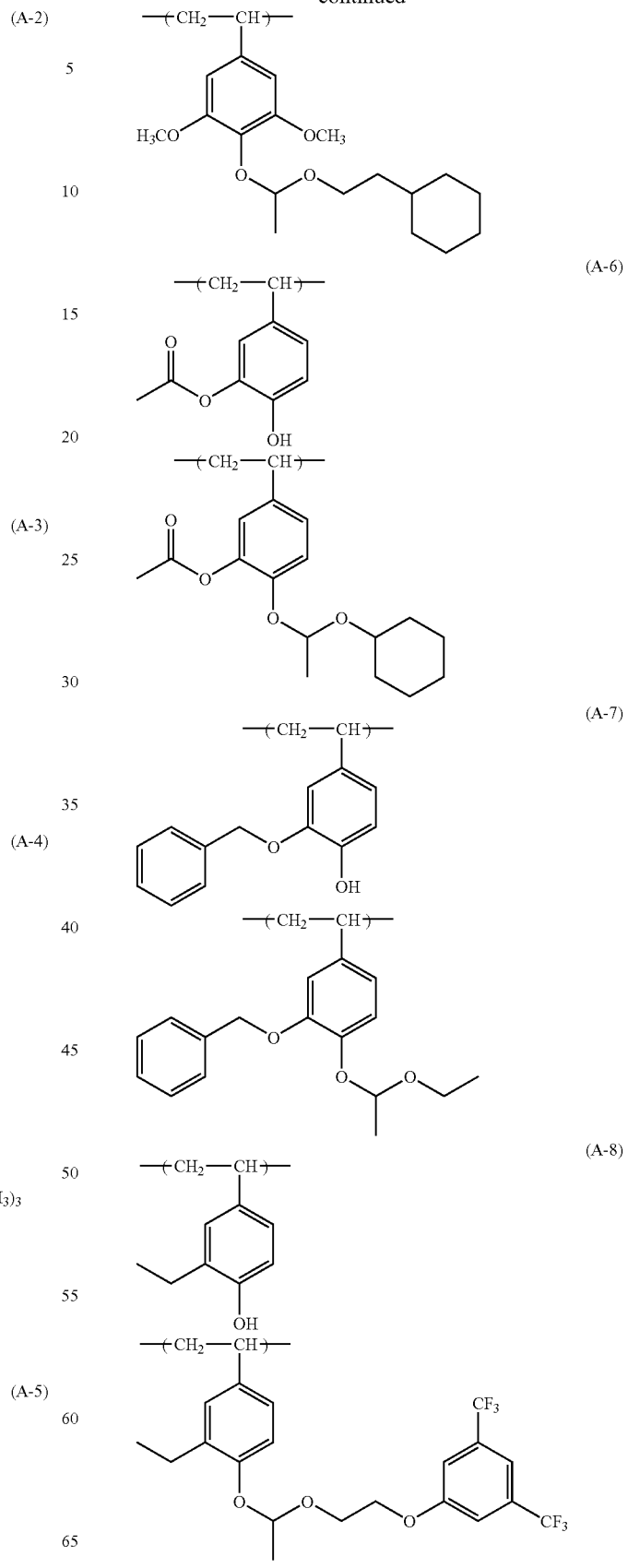

-continued
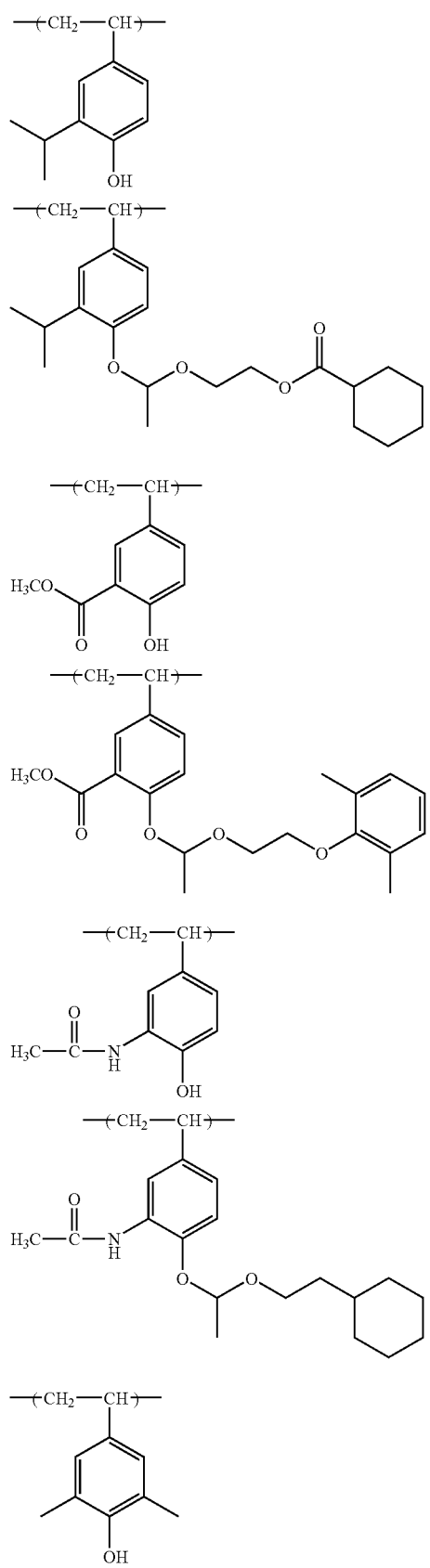
-continued
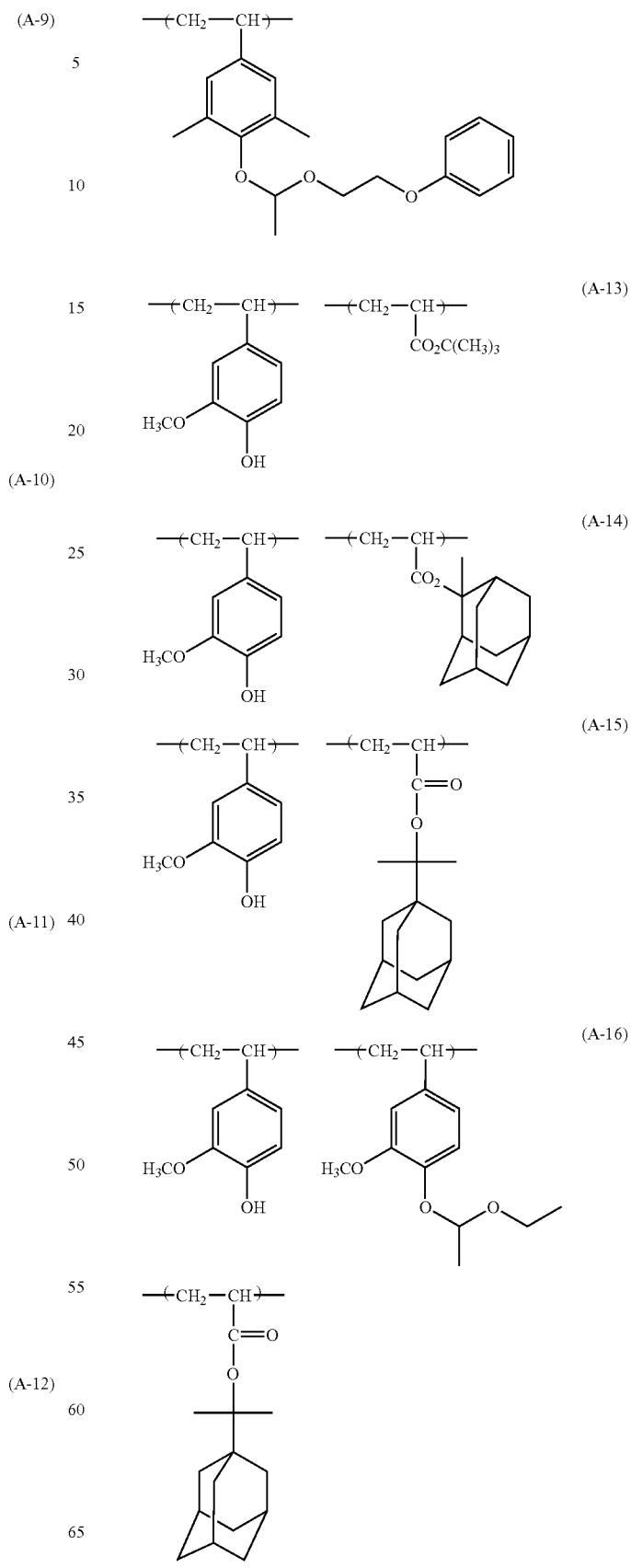

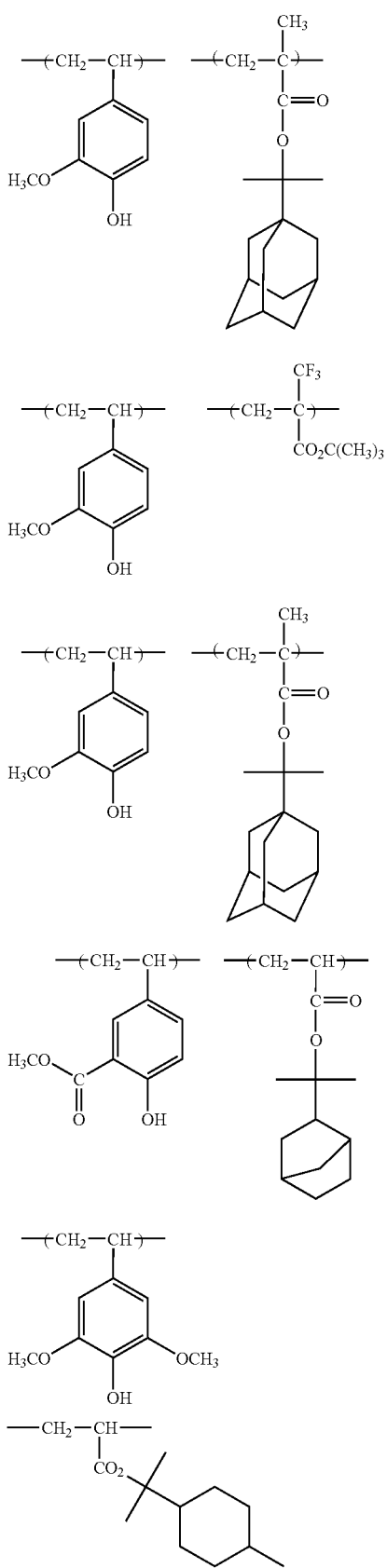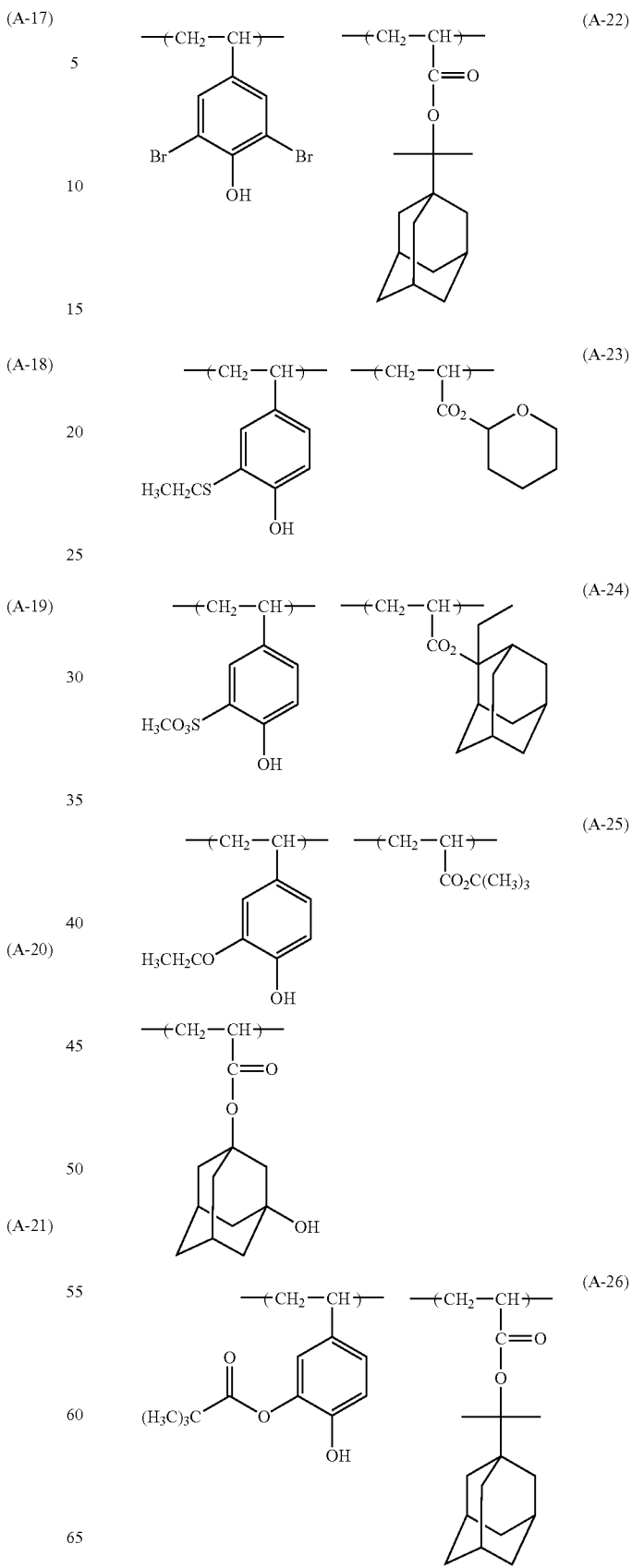

-continued

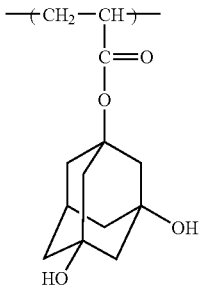

Resin H-1 used as a comparative resin is the following resin.

H-1:

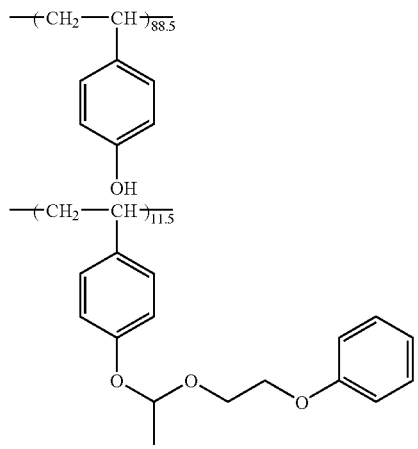

Weight average molecular weight: 8,600
Molecular weight dispersity: 1.55

TABLE 1

| Polymer | Mass Average Molecular Weight | Molecular Weight Dispersity | Compositional Ratio* |
|---|---|---|---|
| A-1a | 8600 | 1.56 | 88.7/11.3 |
| A-1b | 8400 | 1.07 | 88.4/11.6 |
| A-2 | 6500 | 1.52 | 76.4/23.6 |
| A-3 | 5300 | 1.13 | 81.3/18.7 |
| A-4 | 8200 | 1.42 | 86.2/13.8 |
| A-5 | 3700 | 1.51 | 82.7/17.3 |
| A-6 | 9900 | 1.66 | 80.5/19.5 |
| A-7 | 8400 | 1.25 | 66.9/33.1 |
| A-8 | 5100 | 1.21 | 76.6/23.4 |
| A-9 | 3300 | 1.55 | 79.6/20.4 |
| A-10 | 13500 | 1.43 | 74.2/25.8 |
| A-11 | 7400 | 1.48 | 79.1/20.9 |
| A-12 | 15800 | 1.07 | 75.3/24.7 |
| A-13 | 9600 | 1.38 | 65.4/34.6 |
| A-14 | 8200 | 1.54 | 73.2/26.8 |
| A-15 | 8300 | 1.57 | 65.7/34.3 |
| A-16 | 5700 | 1.36 | 43.8/23.4/32.8 |
| A-17 | 12700 | 1.33 | 45.4/54.6 |
| A-18 | 9400 | 1.58 | 63.8/36.2 |
| A-19 | 8700 | 1.49 | 66.9/33.1 |
| A-20 | 9600 | 1.12 | 49.3/50.7 |
| A-21 | 8300 | 1.57 | 67.2/32.8 |
| A-22 | 14500 | 1.46 | 55.8/44.2 |
| A-23 | 6200 | 1.49 | 41.6/58.4 |
| A-24 | 8600 | 1.17 | 54.3/45.7 |

TABLE 1-continued

| Polymer | Mass Average Molecular Weight | Molecular Weight Dispersity | Compositional Ratio* |
|---|---|---|---|
| A-25 | 7100 | 1.52 | 47.5/32.8/19.7 |
| A-26 | 8500 | 1.48 | 48.6/29.4/22.0 |

*Order of repeating units from the left

[Preparation of Resist Composition]

| | |
|---|---|
| Resin of the present invention shown in Table 2 | 0.948 g (as solid content) |
| Acid generator | 0.05 g |
| Organic basic compound | 0.003 g |
| Surfactant | 0.002 g |

These components were dissolved in 16.79 g of a solvent shown in the Table below to prepare a solution having a solid concentration of 5.0 mass %. This solution was filtered through a 0.1-μm Teflon filter to obtain a positive resist solution.

[Production and Evaluation of Pattern (EB)]

The thus-prepared positive resist solution was uniformly coated on a hexamethyldisilazane-treated silicon wafer by using a spin coater and dried under heat at 120° C. for 90 seconds to form a positive resist film having a film thickness of 0.3 μm. This resist film was then irradiated with electron beams by using an electron beam image-drawing apparatus (HL750, manufactured by Hitachi Ltd., accelerating voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and then dried. The obtained pattern was evaluated by the following methods.

[Sensitivity]

The cross-sectional profile of the pattern obtained was observed by using a scanning electron microscope (S-4300, manufactured by Hitachi, Ltd.). The minimum irradiation energy when resolving a 150-nm line (line:space=1:1) was defined as the sensitivity.

[Resolution]

The limiting resolution (the line and space were separated and resolved) at the irradiation dosage of giving the above-described sensitivity was defined as the resolution.

[Line Edge Roughness]

With respect to the region of 50 μm in the longitudinal direction of the 150 nm-line pattern at the irradiation dosage of giving the above-described sensitivity, the distance from a reference line where the edge should be present was measured at arbitrary 30 points by using a scanning electron microscope (S-9220, manufactured by Hitachi, Ltd.) and a standard deviation was determined to calculate 3σ.

[Pattern Profile]

The cross-section of the portion having a line width 150 nm (line/space=1:1) was observed by SEM (S-8840, manufactured by Hitachi, Ltd.) and evaluated according to the following criteria.

A: When the angle between the pattern side wall and the substrate was 90±2° and at the same time, the angle between the pattern side wall and the pattern surface was 90±2°.

B: When the angle between the pattern side wall and the substrate was from 85° to less than 88° or from 92° to less than 95° and at the same time, the angle between the pattern side wall and the pattern surface was from 85° to less than 88° or from 92° to less than 95°.

C: When the angle between the pattern side wall and the substrate was less than 85° or 95° or more, when a T-top profile was observed, or when the entire pattern surface was rounded.

[Evaluation of Line Edge Roughness by In-Vacuum PED (EB)]

A silicon wafer having coated thereon the positive resist film prepared above was set in a vacuum chamber and irradiated with electron beams at an irradiation dosage of giving the above-described sensitivity by using the same electron beam image-drawing apparatus as above. Immediately or 3 hours after the irradiation, the resist film was baked at 100° C. for 90 seconds (heat treatment) and then developed to obtain a line pattern. The 150-nm line pattern obtained when the resist film was baked immediately after the irradiation of electron beams and then developed, and the 150-nm line pattern obtained when the resist film was baked 3 hours after the irradiation of electron beams and then developed were evaluated on the line edge roughness in the same manner as above. The change in the line edge roughness was calculated according to the following formula:

Change in line edge roughness by in-vacuum PED=
(line edge roughness of 150-nm line pattern obtained when baked immediately after irradiation of electron beams and then developed)−
(line edge roughness of 150-nm line pattern obtained when baked 3 hours after irradiation of electron beams and then developed)

The results are shown in Table 2.

B-1:

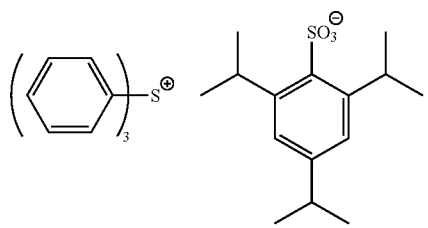

B-2:

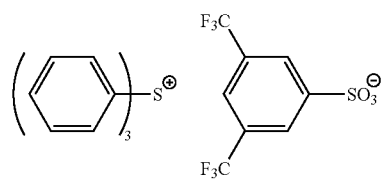

B-3:

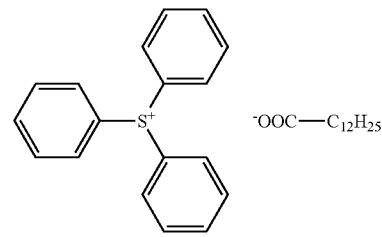

B-4:

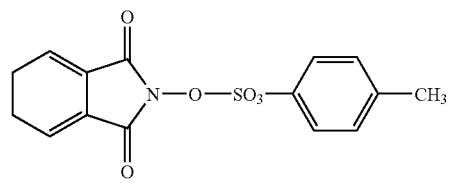

[Surfactant]

D-1: Megafac F176 (produced by Dainippon Ink & Chemicals, Inc.)

D-2: Megafac R08 ((produced by Dainippon Ink & Chemicals, Inc.)

D-3: Troysol S-366 (produced by Troy Chemical Industries, Inc.)

D-4: polyoxyethylene lauryl ether

[Solvent]

S-1: propylene glycol monomethyl ether acetate

S-2: propylene glycol monomethyl ether

[Basic Compound]

N-1: trioctylamine

N-2: 1,5-diazabicyclo[4.3.0]-5-nonene

N-3: 2,4,6-triphenylimidazole

TABLE 2

|  | Resin | Acid Generator (mass ratio) | Basic Compound | Surfactant | Solvent (mass ratio) | Resolution (nm) | Line Edge Roughness (nm) | Pattern Profile | Change in Line Edge Roughness (nm) |
|---|---|---|---|---|---|---|---|---|---|
| Example 1 | A-1a | B-1 | N-2 | D-2 | S-1 | 80 | 4.5 | A | 0.1 |
| 2 | A-1b | B-1 | N-2 | D-2 | S-1 | 80 | 4.4 | A | 0.1 |
| 3 | A-2 | B-1 | N-2 | D-2 | S-1 | 80 | 4.5 | A | 0.2 |
| 4 | A-3 | B-1 | N-2 | D-4 | S-1 | 85 | 5.7 | A | 0.3 |
| 5 | A-4 | B-1 | N-2 | D-2 | S-1 | 80 | 4.8 | A | 0.2 |
| 6 | A-5 | B-1/B-3 (90/10) | N-2 | D-1 | S-1 | 80 | 4.0 | A | 0.1 |
| 7 | A-6 | B-2 | N-1 | D-2 | S-1 | 80 | 4.6 | A | 0.2 |
| 8 | A-7 | B-2 | N-1 | D-2 | S-1/S-2 (80/20) | 85 | 4.1 | A | 0.1 |

TABLE 2-continued

| | Resin | Acid Generator (mass ratio) | Basic Compound | Surfactant | Solvent (mass ratio) | Resolution (nm) | Line Edge Roughness (nm) | Pattern Profile | Change in Line Edge Roughness (nm) |
|---|---|---|---|---|---|---|---|---|---|
| 9 | A-8 | B-2 | N-1 | D-2 | S-1 | 80 | 4.4 | A | 0.2 |
| 10 | A-9 | B-2/B-4 (86/15) | N-3 | D-3 | S-1 | 80 | 4.1 | A | 0.1 |
| 11 | A-10 | B-2 | N-3 | D-3 | S-1 | 80 | 4.7 | A | 0.2 |
| 12 | A-11 | B-2 | N-3 | D-4 | S-1 | 80 | 5.1 | A | 0.1 |
| 13 | A-12 | B-2 | N-2 | D-2 | S-1/S-2 (70/30) | 80 | 4.0 | A | 0.1 |
| 14 | A-13 | B-2 | N-1 | D-3 | S-1 | 80 | 5.9 | A | 0.3 |
| 15 | A-14 | B-1 | N-2 | D-3 | S-1 | 80 | 4.6 | A | 0.3 |
| 16 | A-15 | B-1 | N-1 | D-2 | S-1 | 80 | 4.5 | A | 0.1 |
| 17 | A-16 | B-1 | N-2 | D-3 | S-1 | 80 | 4.7 | A | 0.1 |
| 18 | A-17 | B-1 | N-3 | D-3 | S-1 | 80 | 4.0 | A | 0.2 |
| 19 | A-18 | B-1 | N-2 | D-2 | S-1 | 80 | 5.7 | A | 0.3 |
| 20 | A-19 | B-2 | N-2 | D-2 | S-1 | 80 | 4.6 | A | 0.1 |
| 21 | A-20 | B-2 | N-3 | D-2 | S-1 | 80 | 4.7 | A | 0.2 |
| 22 | A-21 | B-2 | N-1 | D-1 | S-1 | 80 | 4.7 | A | 0.2 |
| 23 | A-22 | B-2 | N-3 | D-2 | S-1 | 80 | 4.6 | A | 0.2 |
| 24 | A-23 | B-1 | N-1 | D-1 | S-1 | 80 | 4.4 | A | 0.1 |
| 25 | A-24 | B-1 | N-3 | D-2 | S-1/S-2 (70/30) | 80 | 4.1 | A | 0.1 |
| 26 | A-25 | B-1 | N-1 | D-2 | S-1 | 80 | 4.6 | A | 0.2 |
| 27 | A-26 | B-1 | N-2 | D-3 | S-1/S-2 (90/10) | 80 | 3.9 | A | 0.1 |
| Comparative Example 1 | A-1a | B-1 | — | D-2 | S-1 | 100 | 8.4 | C | 0.5 |
| 2 | H-2 | B-1 | N-2 | D-2 | S-1 | 90 | 9.1 | C | 0.7 |

As seen from the results in Table 2, regarding the pattern formation by the irradiation of electron beams, the resist composition of the present invention ensures high resolution, excellent line edge roughness and pattern profile, and small change in the line edge roughness due to in-vacuum PED as compared with the composition of Comparative Examples.

[Production and Evaluation of Pattern (EUV)]

From each resist composition of Examples 1, 6, 8 and 14 and Comparative Examples 1 and 2, a resist film was obtained in the same manner as in Example 1. However, the resist film thickness was 0.15 μm here. The resist film obtained was subjected to surface exposure by using EUV light (wavelength: 13 nm) while changing the exposure dosage in steps of 0.5 mJ in the range from 0 to 10.0 mJ and then baked at 110° C. for 90 seconds. Thereafter, the dissolution rate at each exposure dosage was measured by using an aqueous 2.38 mass % tetramethylammonium hydroxide (TMAH) solution to obtain a sensitivity curve. The exposure dosage when the dissolution rate of the resist was saturated in this sensitivity curve was defined as the sensitivity and also, the dissolution contrast (γ value) was calculated from the gradient of the straight line part in the sensitivity curve. As the γ value is larger, the dissolution contrast is more excellent. These results are shown in Table 3 as Examples 28 to 31 and Comparative Examples 3 and 4, respectively.

TABLE 3

| | Sensitivity (mJ/cm$^2$) | γ Value |
|---|---|---|
| Example 28 | 2.0 | 9.6 |
| Example 29 | 2.0 | 10.7 |
| Example 30 | 2.0 | 10.8 |
| Example 31 | 2.0 | 9.4 |
| Comparative Example 3 | 4.0 | 7.1 |
| Comparative Example 4 | 4.5 | 7.4 |

As seen from the results in Table 3, in the characteristic evaluation when exposed by the irradiation of EUV light, the resist composition of the present invention is excellent to exhibit high sensitivity and high contrast as compared with the composition of Comparative Examples.

This application is based on Japanese patent application JP 2004-044693, filed on Feb. 20, 2004, the entire content of which is hereby incorporated by reference, the same as if set forth at length.

What is claimed is:

1. A positive resist composition comprising:
    (A) a resin containing a repeating unit represented by formula (I), which is insoluble or hardly soluble in an alkali developer and becomes soluble in an alkali developer under the action of an acid;
    (B) a compound capable of generating an acid upon irradiation with actinic rays or radiation; and
    (C) an organic basic compound:

(I)

wherein $R_1$ represents a hydrogen atom, a methyl group, a cyano group, a halogen atom or a perfluoro group,
$R_2$ represents a non-acid-decomposable group containing an oxygen atom,
X represents a hydrogen atom or an organic group,
m represents an integer of 1 to 4,
n represents an integer of 1 to 4, provided that $2 \leq n+m \leq 5$,
when m is an integer of 2 to 4, multiple Xs may be the same or different, and when n is an integer of 2 to 4, multiple $R_2$s may be the same or different.

2. The positive resist composition as claimed in claim 1, wherein the repeating unit represented by formula (I) is a repeating unit represented by formula (Ia):

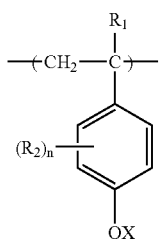

(Ia)

wherein $R_1$ represents a hydrogen atom, a methyl group, a cyano group, a halogen atom or a perfluoro group, $R_2$ represents a non-acid-decomposable group, X represents a hydrogen atom or an organic group, n represents an integer of 1 to 4, and when n is an integer of 2 to 4, multiple $R_2$s may be the same or different.

3. The positive resist composition as claimed in claim 1, wherein the repeating unit represented by formula (I) is a repeating unit represented by formula (Ib):

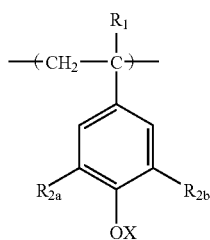

(Ib)

wherein $R_1$ represents a hydrogen atom, a methyl group, a cyano group, a halogen atom or a perfluoro group, X represents a hydrogen atom or an organic group, and $R_{2a}$ and $R_{2b}$ each independently represents a hydrogen atom or a non-acid-decomposable group, provided that at least one of $R_{2a}$ and $R_{2b}$ is a non-acid-decomposable group.

4. The positive resist composition as claimed in claim 1, wherein the non-acid-decomposable group of $R_2$ in formula (I) is an alkoxy group.

5. The positive resist composition as claimed in claim 1, wherein the resin (A) further contains a repeating unit represented by formula (II):

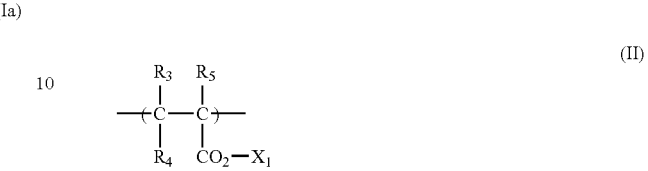

(II)

wherein $R_3$ to $R_5$ each independently represents a hydrogen atom, a fluorine atom, a chlorine atom, a cyano group or an alkyl group, and $X_1$ represents a hydrogen atom or an organic group.

6. The positive resist composition as claimed in claim 5, wherein a group of $X_1$ in formula (II) contains at least one of an alicyclic structure and an aromatic ring structure.

7. The positive resist composition as claimed in claim 1, which further comprises (D) a surfactant.

8. The positive resist composition as claimed in claim 1, wherein the component (B) includes (B1) a compound capable of generating an organic sulfonic acid under the action of actinic rays or radiation.

9. The positive resist composition as claimed in claim 8, wherein the component (B) further includes (B2) a compound capable of generating a carboxylic acid under the action of actinic rays or radiation.

10. The positive resist composition as claimed in claim 1, which further comprises a solvent.

11. The positive resist composition as claimed in claim 10, wherein the solvent contains propylene glycol monomethyl ether acetate.

12. The positive resist composition as claimed in claim 11, wherein the solvent further contains propylene glycol monomethyl ether.

13. The positive resist composition as claimed in claim 1, which is for an exposure by the irradiation of electron beam, X-ray or EUV.

14. A pattern forming method comprising: forming a resist film by using the positive resist composition claimed in claim 1; and exposing and developing said resist film.

* * * * *